United States Patent [19]

Ozaki

[11] Patent Number: 4,796,356
[45] Date of Patent: Jan. 10, 1989

[54] PROCESS FOR MAKING CLOSE TOLERANCE THICK FILM RESISTORS

[75] Inventor: Thomas Ozaki, Sycamore, Ill.

[73] Assignee: GTE Communication Systems Corporation, Phoenix, Ariz.

[21] Appl. No.: 90,193

[22] Filed: Aug. 27, 1987

[51] Int. Cl.[4] ............................................. H01C 17/06
[52] U.S. Cl. ........................................ 29/620; 29/613; 338/308; 338/309; 427/101; 427/103; 427/125
[58] Field of Search .................. 29/620, 613; 338/308, 338/309; 427/101, 102, 103, 125

[56] References Cited

U.S. PATENT DOCUMENTS 3,699,649 10/1972 McWilliams ............................ 29/620
4,031,272 6/1977 Khanna .................................. 427/101
4,728,534 3/1988 Ho et al. ................................ 427/103

Primary Examiner—P. W. Echols
Attorney, Agent, or Firm—Anthony Miologos

[57] ABSTRACT

A process for manufacturing close tolerance thick film resistors on a ceramic dielectric substrate is disclosed. The process includes the steps of printing resistor terminations to the dielectric substrate using a precious conductor material and fixing the resistor terminations by drying and firing in air. A resistive material is next printed to portions of the resistor terminations and to the dielectric substrate intermediate the resistor terminations. The resistive material is fixed by drying and firing in air. Terminal pads, conductor traces and resistor interconnections are printed on the dielectric substrate using a base conductor material. The resistor interconnections are also printed to the resistor terminations and to portions of the resistive material. The terminal pads, conductor traces and resistor interconnections are then air dried and fired in nitrogen. The resistor material is trimmed to tolerance by kerfing the resistor material and a dielectric encapsulant is printed substantially over the resistor interconnections and resistive material. The encapsulant is cured using an infrared light source, or conventional oven.

10 Claims, 1 Drawing Sheet

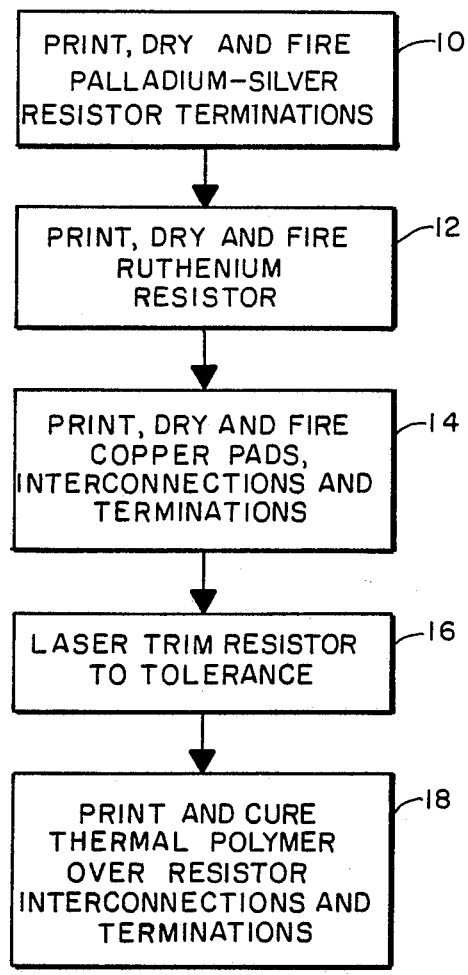

PROCESS FOR MAKING CLOSE TOLERANCE THICK FILM RESISTORS

BACKGROUND OF THE INVENTION

This invention relates in general to the manufacture of ceramic hybrid microcircuits and more particularly to a novel process for making thick film resistors.

Present methods utilized in the manufacture of the thick film resistors include a multi-stepped process which builds the resistors and interconnects on the substrate. This process first includes printing, drying and firing of a conductor material, normally palladium-silver (Pd-Ag), as pads, interconnects and terminations. Then, a Ruthenium based resistor material is printed on the substrate between the palladium-silver pads. The deposited resistor material is subsequently dried and fired. Next, a glass encapsulant is printed, dried and fired over the conductor pads and resistor. Finally, the thick film resistor is laser trimmed to tolerance.

The major disadvantage of the process outlined above is material cost. Palladium-silver paste is generally expensive. Further, since it is a precious metal its cost is subject to wild and rapid market fluctuations. This price fluctuation provides difficulty in pricing circuits and budgeting for manufacturing cost.

The thick film industry has been searching for an alternative to precious metal conductors and as a result has developed base metal conductors, like copper, which can provide conductors with greater conductivity than with palladium-silver material. However, base metal conductors must be fired in a nitrogen atmosphere. Unfortunately, resistor paste technology still required the use of air firing.

In order to make the conductor firing compatible with the presently known resistor pastes material manufacturers developed low temperature firing copper conductors which can be used with air fired resistor technology. Air fired resistors compatible with copper conductor material are not compatible with any nitrogen fired glass overcoats. Air fired overcoats cannot be used since air firing will result in oxidation of the copper film.

Encapsulants are required to provide long term stability to the thick film resistors of less than 0.25% ohms, per 1000 hours, at 150 degrees C. to 85 degrees C.

It therefor becomes an object of the present invention to provide a novel process for manufacturing thick film resistors using base metal conductors and encapsulation.

SUMMARY OF THE INVENTION

In accomplishing the object of the present invention there is provided a process for manufacturing close tolerance thick film resistors on a ceramic dielectric substrate.

The process of the present invention includes the steps of printing resistor terminations in the form of a thick film paste to the dielectric substrate using a precious conductor material. The resistor terminations are fixed to the substrate by drying in air and firing the resistor terminations in air at 850 degrees C.

Next, a resistive material is printed to portions of the resistor terminations and to the dielectric substrate intermediate the resistor terminations. The resistive material is fixed to the resistor terminations and the substrate by drying in air and firing the resistive material in air at 850 degrees C.

A base conductor material paste, is printed on the substrate to form terminal pads and conductor traces. The conductor traces extend from the terminal pads to resistor interconnections. The resistor interconnections are printed to the resistor terminations and to portions of the resistive material and are also composed of the base metal conductor material. Again, the terminal pads, conductor traces and resistor interconnections are fixed by drying in air and firing in nitrogen at 600 degrees C.

The resistive material is now trimmed to tolerance by kerfing the resistive material.

Finally, a polymer based dielectric encapsulant is printed substantially over the resistor interconnections and resistive material. The encapsulant is cured using an infrared light source or conventional oven at 200 degrees C. in air.

BRIEF DESCRIPTION OF THE DRAWINGS

The single sheet of drawings included herewith comprise a block diagram of the steps embodying the principles of the processes of the present invention.

DESCRIPTION OF THE PREFERRED INVENTION

Turning now to the included drawings the process for making low tolerance thick film resistors in accordance with the present invention includes the steps of.

Printing a pair of precious metal resistor terminations 10 such as palladium-silver (Pd-Ag) on a ceramic substrate. The printed terminations are then dried and fired in air at a temperature of 850 degrees C.

Next a Ruthenium based resistor material 12 such as DUPONT ® 1600, 1700 or 6300 series thick film resistor material is printed over the precious metal terminations. Portions of terminations are not covered by the resistor material in order to accept the conductor material of the next step. Then the printed resistor material is dried and fired at 850 degrees C. in air.

A layer of a base metal conductor, such as copper is printed on the substrate 14, forming terminal pads and conductor runs. The copper conductor is also printed over the precious metal resistor terminations making a conductive connection between the uncovered portions of the resistor terminations and the copper conductor. The copper is then allowed to dry and subsequently fired at 600 degrees C. in nitrogen.

The now formed resistor is trimmed by using a laser 16. The laser kerfs the resistor to a specified tolerance.

Finally, a dielectric overglaze 18 is printed over the thick film resistor, such as the MINICO M-7000 TM encapsulant. This polymer based encapsulant is cured using an infrared light source or conventional oven at 200 degrees C. in air.

Thermal polymer encapsulation has advantages over conventional glass encapsulation in that moisture is not trapped within the encapsulant during the curing process. The trapped moisture leads to fluctuations in the ohmic value of the thick film resistor. The infrared curable encapsulant allows for a long term resistor stability of less than 0.25% ohms, per 1000 hours, at 150 degrees C. to 85 degrees C.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A process for manufacturing close tolerance thick film resistors on a ceramic dielectric substrate comprising the steps of:

printing at least first and second resistor terminations to said dielectric substrate using a precious conductor material;

fixing said resistor terminations to said dielectric substrate by air drying and air firing said said resistor terminations;

printing a resistive material to portions of said first and second resistor terminations and to said dielectric substrate intermediate said first and second resistor terminations;

fixing said resistive material to said first and second terminations and said dielectric substrate by air drying and air firing said resistive material;

printing, using a base conductor material, at least first and second terminal pads and first and second conductor traces to said dielectric substrate, said first and second conductor traces extending from said first and second terminal pads respectively to at least first and second resistor interconnections, said first and second resistor interconnections printed to said first and second resistor terminations and to portions of said resistive material;

fixing said first and second terminal pads, first and second conductor traces and first and second resistor interconnections by air drying and firing in nitrogen;

printing a dielectric encapsulant substantially over said first and second resistor interconnections and resistive material; and, curing said dielectric encapsulant using a thermal source.

2. The process for manufacturing thick film resistors claimed in claim 1, wherein: said resistive material is trimmed to tolerance before said encapsulant is printed over said resistive material.

3. The process for manufacturing thick film resistors claimed in claim 2, wherein: said resistive material is trimmed to tolerance by kerfing said resistive material.

4. The process for manufacturing thick film resistors claimed in claim 1, wherein: said resistor terminations precious conductor material is a palladium-silver compound which is fired at 850 degrees C. in air.

5. The process for manufacturing thick film resistors claimed in claim 1, wherein: said resistive material is a ruthenium based compound which is fired at 850 degrees in air.

6. The process for manufacturing thick film resistors claimed in claim 1, wherein: said first and second terminal pads, first and second conductor traces and first and second resistor interconnections base conductor material is a copper compound which is fired at 600 degrees C. in nitrogen.

7. The process for manufacturing thick film resistors claimed in claim 1, wherein: said encapsulant is a dielectric polymer compound which is cured using an infrared light source at 200 degrees in air.

8. The process for manufacturing thick film resistors claimed in claim 1, wherein: said encapsulant is a dielectric polymer compound which is cured using a conventional oven at 200 degrees in air.

9. A process for manufacturing close tolerance thick film resistors on a ceramic dielectric substrate comprising the steps of:

printing resistor terminations to said dielectric substrate using a precious conductor material;

fixing said resistor terminations to said dielectric substrate by air drying and firing said resistor terminations at 850 degrees C. in air;

printing a resistive material to portions of said resistor terminations and to said dielectric substrate intermediate said resistor terminations;

fixing said resistive material to said resistor terminations and said dielectric substrate by air drying and firing said resistive material at 850 degrees C in air;

printing, using a base conductor material, terminal pads and conductor traces to said dielectric substrate, said conductor traces extending from said terminal pads to resistor interconnections, said resistor interconnections printed to said resistor terminations and to portions of said resistive material;

fixing said terminal pads, conductor traces and resistor interconnections by air drying and firing said terminal pads, conductor traces and resistor interconnections at 600 degrees C. in nitrogen;

trimming said resistor material to tolerance;

printing a dielectric encapsulant substantially over said resistor interconnections and resistive material; and, curing said dielectric encapsulant using a thermal source at 200 degrees C. in air.

10. The process for manufacturing thick film resistors claimed in claim 9, wherein: said resistive material is trimmed to tolerance by kerfing said resistive material.

* * * * *